United States Patent
Chen et al.

(10) Patent No.: US 9,484,373 B1
(45) Date of Patent: Nov. 1, 2016

(54) HARD MASK AS CONTACT ETCH STOP LAYER IN IMAGE SENSORS

(71) Applicant: OMNIVISION TECHNOLOGIES, INC., Santa Clara, CA (US)

(72) Inventors: Gang Chen, San Jose, CA (US); Yuanwei Zheng, San Jose, CA (US); Duli Mao, Sunnyvale, CA (US); Dyson Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/944,772

(22) Filed: Nov. 18, 2015

(51) Int. Cl.
*H01L 31/18* (2006.01)
*H01L 27/146* (2006.01)

(52) U.S. Cl.
CPC ..... *H01L 27/1462* (2013.01); *H01L 27/14685* (2013.01)

(58) Field of Classification Search
None
See application file for complete search history.

(56) References Cited

U.S. PATENT DOCUMENTS

| | | | | |
|---|---|---|---|---|
| 7,364,967 B2* | 4/2008 | Kim | ................. | H01L 27/10817 257/304 |
| 7,446,386 B2* | 11/2008 | Eristoff | ............ | H01L 27/14645 257/440 |
| 2006/0024948 A1* | 2/2006 | Oh | .................... | H01L 21/76807 438/622 |
| 2009/0091037 A1* | 4/2009 | Assefa | .................... | H01L 43/12 257/773 |
| 2010/0213561 A1* | 8/2010 | Assefa | ............... | G02B 6/12004 257/432 |
| 2013/0040415 A1* | 2/2013 | Arakawa | .......... | H01L 27/14627 438/68 |
| 2015/0097291 A1* | 4/2015 | Huisinga | ............. | H01L 23/5226 257/751 |
| 2015/0235957 A1* | 8/2015 | Zhang | ............... | H01L 23/53266 257/751 |
| 2016/0079429 A1* | 3/2016 | Ellinger | ........... | H01L 29/41733 257/43 |
| 2016/0223749 A1* | 8/2016 | Coolbaugh | .............. | G02B 6/13 438/69 |

* cited by examiner

*Primary Examiner* — Alexander Ghyka
(74) *Attorney, Agent, or Firm* — Blakely Sokoloff Taylor & Zafman LLP

(57) ABSTRACT

An image sensor includes a semiconductor material with a photodiode disposed in the semiconductor material, and a transfer gate disposed adjacent to an edge of the photodiode. A dielectric layer is also disposed between the semiconductor material and the transfer gate. A hard mask is disposed in an encapsulation layer and lateral bounds of the hard mask are coextensive with lateral bounds of the transfer gate. A first contact trench extends through the encapsulation layer and through the dielectric layer and contacts the semiconductor material. A second contact trench extends through the encapsulation layer and through the hard mask and contacts the transfer gate.

9 Claims, 4 Drawing Sheets

DEPOSIT LAYER STACK (PD OPTIONAL)

ETCH LAYER STACK

DEPOSIT TRANSFER GATE ISOLATION REGIONS
AND ENCAPSULATION MATERIAL

ETCH CONTACT TRENCHES, DEPOSIT CONTACTS,
AND FORM OPTICAL ARCHITECTURE

HARD MASK AS CONTACT ETCH STOP LAYER IN IMAGE SENSORS

TECHNICAL FIELD

This disclosure relates generally to semiconductor fabrication, and in particular but not exclusively, relates to the construction of etch stop layers.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Contact etch stop layers are used to ensure that electrical contacts form in the proper layer(s) of image sensor device architecture. They allow for precision manipulation of etch rate as well as controlled stoppage on critical device structures. Stress induced by contact etch stop layers has also been shown to boost transistor drivability and enhance image sensor performance.

However, the use of contact etch stop layers is not without its drawbacks. Their inherent positive charge can reduce silicon surface hole concentration and increase dark current among integrated circuit devices. Additionally, the stress induced by contact etch stop layers can cause silicon lattice distortion and result in circuit noise.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
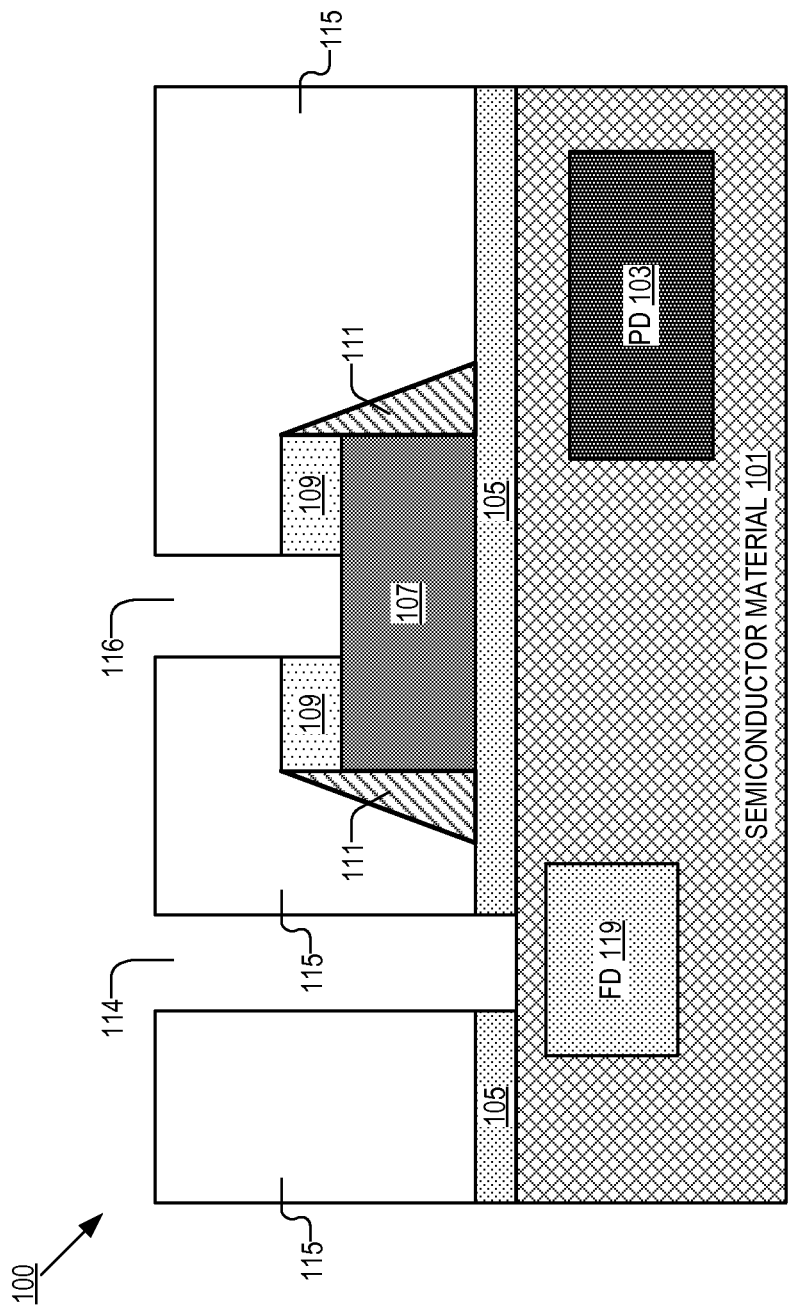
FIG. 1 is a cross sectional illustration of one example of an image sensor with a hard mask etch stop layer, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with a hard mask etch stop layer are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a cross sectional illustration of one example of an image sensor 100 with a hard mask 109 being used as a contact etch stop layer. In the depicted example, image sensor 100 includes: semiconductor material 101, photodiode 103, dielectric layer 105, transfer gate 107, hard mask 109, transfer gate spacers 111, encapsulation layer 115, and floating diffusion 119. Photodiode 103 is disposed in semiconductor material 101, and transfer gate 107 may be disposed proximate to an edge of photodiode 103. In the illustrated example, dielectric layer 105 is disposed between semiconductor material 101 and transfer gate 107, and transfer gate 107 is positioned near the edge of photodiode 103 to extract image charge from photodiode 103. In one example, transfer gate 107 includes polysilicon. Dielectric layer 105 may include a high-k dielectric material such as hafnium oxide, aluminum oxide, titanium oxide, or the like. Hard mask 109 is disposed in encapsulation layer 115, and lateral bounds of hard mask 109 are coextensive with lateral bounds of transfer gate 107. In one example, hard mask 109 is a dielectric material such as silicon oxide, silicon nitride, or silicon oxynitride. In the depicted example, a first contact trench 114 extends through encapsulation layer 115, through dielectric layer 105, and contacts semiconductor material 101. Additionally, a second contact trench 116 extends through encapsulation layer 115, through the hard mask 109, and contacts transfer gate 107. In one example, image sensor 100 also includes transfer gate spacers 111 disposed on lateral edges of the transfer gate 107. In the depicted example, the cross sectional area of transfer gate spacers 111 is larger in a direction of semiconductor material 101.

Although not depicted in FIG. 1, in one example, a first electrical contact and a second electrical contact may be disposed in contact trenches 114 and 116. The first electrical contact is disposed in first contact trench 114 and is electrically coupled to semiconductor material 101. The second electrical contact is disposed in second contact trench 116 and is electrically coupled to transfer gate 107. In a different example; however, the first electrical contact and second electrical contact may be physically connected to semiconductor material 101 and transfer gate 107, respectively. Additionally, floating diffusion 119 may be disposed in semiconductor material 101, and floating diffusion 119 may be proximate to photodiode 103 and at least in part under transfer gate 107 as shown.

In operation, image sensor 100 is positioned to absorb light. Light enters photodiode 103 and is converted into hole-electron pairs. In one example, photodiode 103 is a pinned photodiode to further aid in the separation of bound excitons into usable image charge. After photodiode 103 has collected a certain image charge, a gate voltage ($V_g$) is applied to transfer gate 107. The application of $V_g$ to transfer gate 107 lowers the potential barrier between photodiode 103 and floating diffusion 119, allowing for image charge to be transferred from photodiode 103 to floating diffusion 119. In one example not depicted, photodiode 103 and/or floating diffusion 119 may be surrounded by electrical isolation regions in order to prevent cross talk between neighboring photodiodes/pixels. These isolation regions may include heavily doped semiconductor, oxides, polymers, or any combination thereof. Additionally, in one or more examples, photodiode 103 may include a different or the same semiconductor material as semiconductor material 101. For example, photodiode 103 may include germanium where semiconductor material 101 may include silicon.

Figure 2:
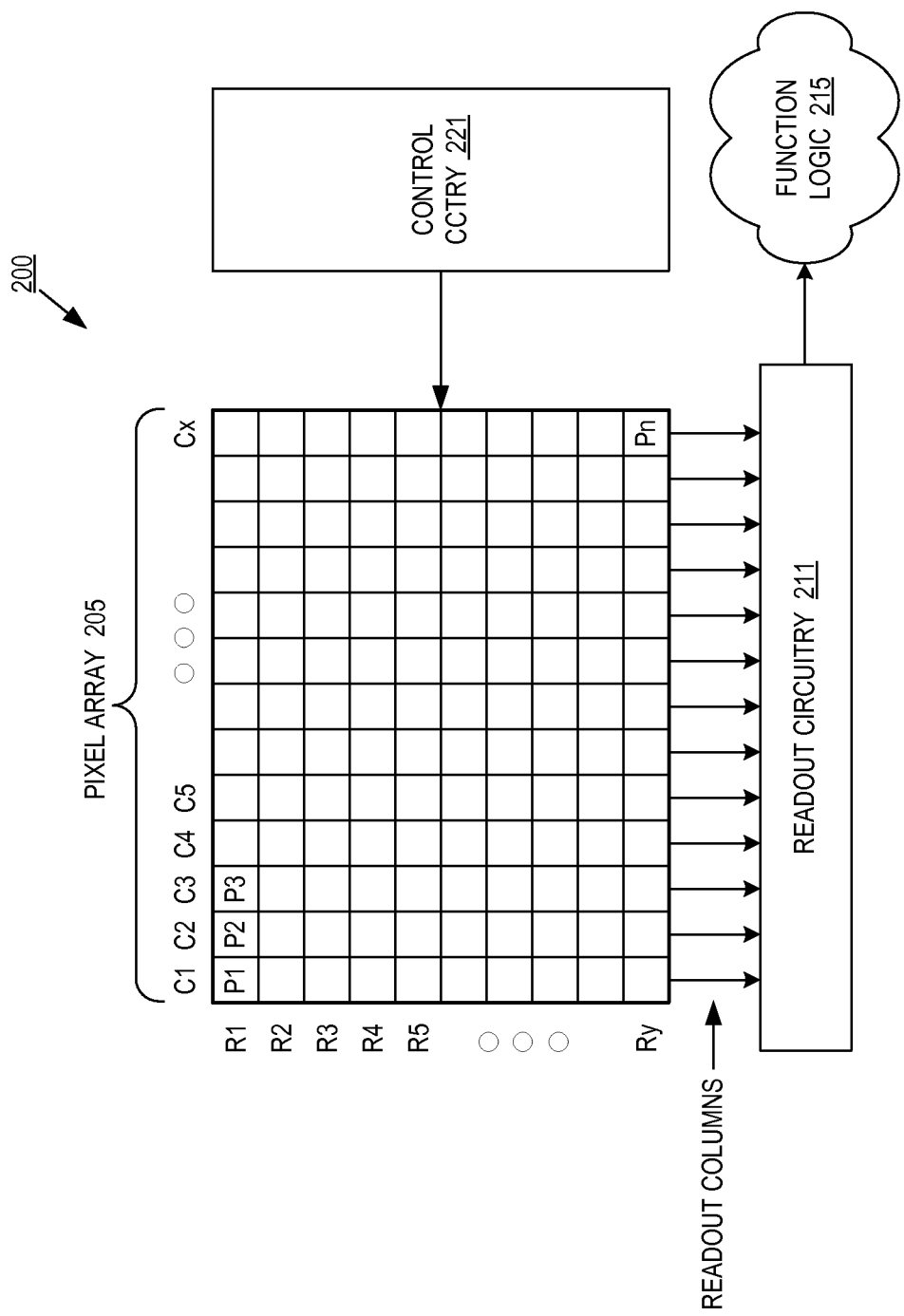
FIG. 2 is a block diagram illustrating one example of an imaging system including the image sensor of FIG. 1, in accordance with the teachings of the present invention.

FIG. 2 is a block diagram illustrating one example of an imaging system 200 including the image sensor of FIG. 1 (e.g., image sensor 100). Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, the rows and columns do not necessarily have to be linear and may take other shapes depending on use case.

In one example, after each image sensor photodiode/pixel in pixel array 205 has acquired its image data or image charge, the image data is readout by readout circuitry 211 and then transferred to function logic 215. Readout circuitry 211 may be coupled to readout image data from the plurality of photodiodes in pixel array 205. In various examples, readout circuitry 211 may include amplification circuitry, analog-to-digital conversion (ADC) circuitry, or otherwise. Function logic 215 may simply store the image data or even alter/manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, or the like. Additionally, imaging system 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware/software may deliver instructions to imaging system 200, extract image data from imaging system 200, or manipulate image data supplied by imaging system 200.

FIGS. 3A-3D show an example process 300 for forming an image sensor with a hard mask 309 as a contact etch stop layer (e.g., image sensor 100). The order in which some or all of FIGS. 3A-3D appear in process 300 should not be deemed limiting. Rather, one of ordinary skill in the art having the benefit of the present disclosure will understand that some of the process 300 may be executed in a variety of orders not illustrated, or even in parallel.

It is worth noting that the device architecture and process depicted herein, allows for the simple fabrication of a contact etch stop layer (i.e., hard mask material 309) without the use of additional processing steps. The fabrication of conventional image sensors often requires removal of hard mask material 309 and deposition of an additional contact etch stop layer in order to prevent damage to the transfer gate 307 when etching a trench to contact transfer gate 307. By leaving hard mask 309 on transfer gate 307, the need for additional processing steps is eliminated, which may suppress damage/loss to dielectric layer 305. Moreover, dark current is decreased and the probability of damaging transfer gate 307 during the contact etching process is also reduced.

Figure 3A:
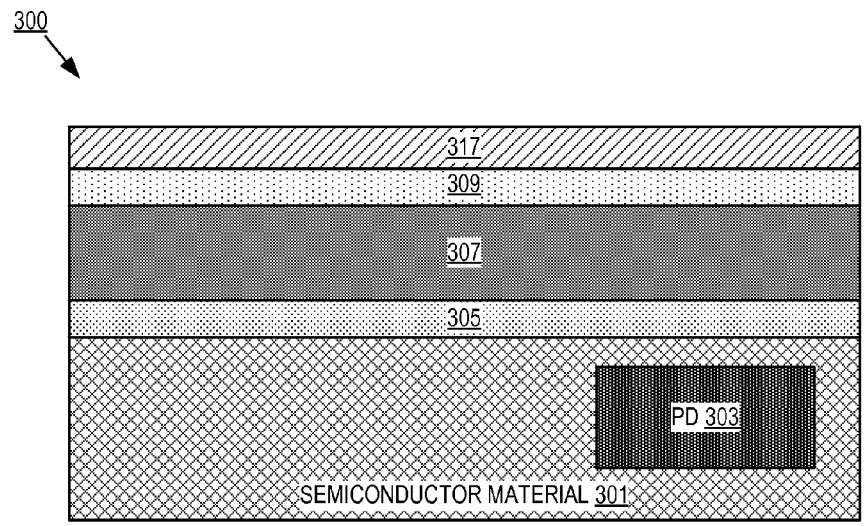
FIGS. 3A-3D show an example process for forming an image sensor with a hard mask etch stop layer, in accordance with the teachings of the present invention.

FIG. 3A depicts an illustration of forming a layer of dielectric material 305, a layer of gate material 307, a layer of hard mask material 309, and a layer of photoresist 317 on semiconductor material 301 (which contains photodiode 303). In one example, each of the aforementioned layers is deposited via chemical vapor deposition, atomic layer deposition, molecular beam epitaxy, or the like. Although not depicted in FIG. 3, in one example, a floating diffusion (e.g., floating diffusion 119) may be formed in semiconductor material 301, and the floating diffusion may be disposed adjacent to a lateral edge of transfer gate 307. Layer of dielectric material 305 is disposed between layer of gate material 307 and semiconductor material 301, and may consist of a high-k metal oxide such as hafnium oxide, or the like. Layer of gate material 307 is disposed between layer of hard mask material 309 and layer of dielectric material 305. In one example, forming layer of gate material 307 includes depositing a polysilicon layer on layer of dielectric material 305. In the depicted example, photodiode 303 is formed in semiconductor material 301 such that the lateral edge of photodiode 303 is disposed proximate to a lateral edge of transfer gate 307. This may permit efficient charge transfer from photodiode 303 to readout circuitry (e.g., readout circuitry 211). However, in a different example, photodiode 303 may not be formed at this stage in the fabrication process 300. Photodiode 303 may be formed earlier or later in process 300 depending on optimization of process steps, cost reduction, fabrication restrictions due to the presence of other layers of device architecture, etc.

Figure 3B:
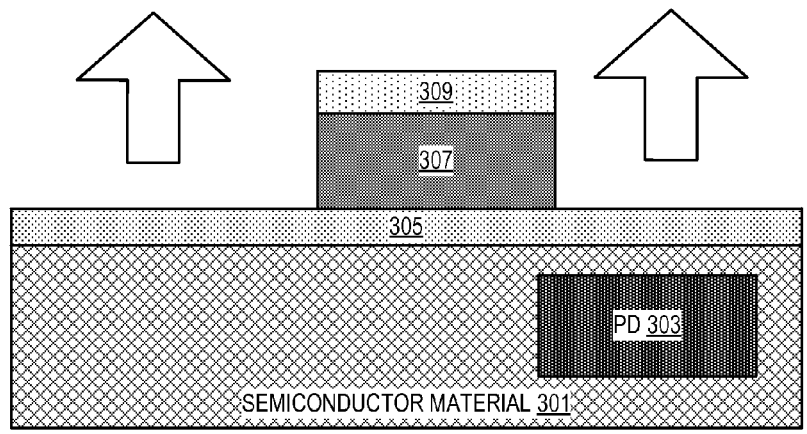

FIG. 3B depicts an illustration of the etching of the layer of hard mask material 309 and the etching of the layer of gate material 307. This etching process forms a transfer gate 307 from layer of gate material 307. In the depicted example, after the etching process, the lateral bounds of transfer gate 307 are coextensive with the lateral bounds of the remaining layer of hard mask material 309. However, in an alternate example not depicted, the lateral bounds of transfer gate 307 may be larger than the lateral bounds of the remaining layer of hard mask material 309. It should be noted, that the etching process in FIG. 3B may be accomplished with a wet or dry etch, depending on processing restrictions, material selection, cost, or otherwise. Additionally, both layer of gate material 307 and layer of hard mask material 309 may have high etch selectivity.

Figure 3C:
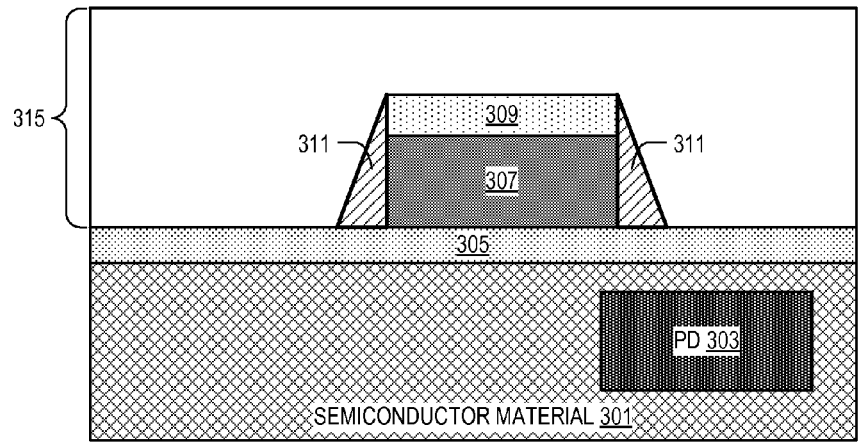

FIG. 3C depicts an illustration of depositing encapsulation material 315, where encapsulation material 315 is disposed proximate to a surface of semiconductor material 301. In the depicted example, transfer gate spacers 311 are also formed along lateral edges of transfer gate 307 and along the lateral edges of layer of hard mask material 309. In other words, transfer gate spacers 311 extend from semiconductor material 301, to the exposed edge of layer of hard mask material 309. However, in another example, transfer gate spacers 311 may only extend along the lateral edges of transfer gate 307 and not along the lateral edges of layer of hard mask material 309.

Figure 3D:
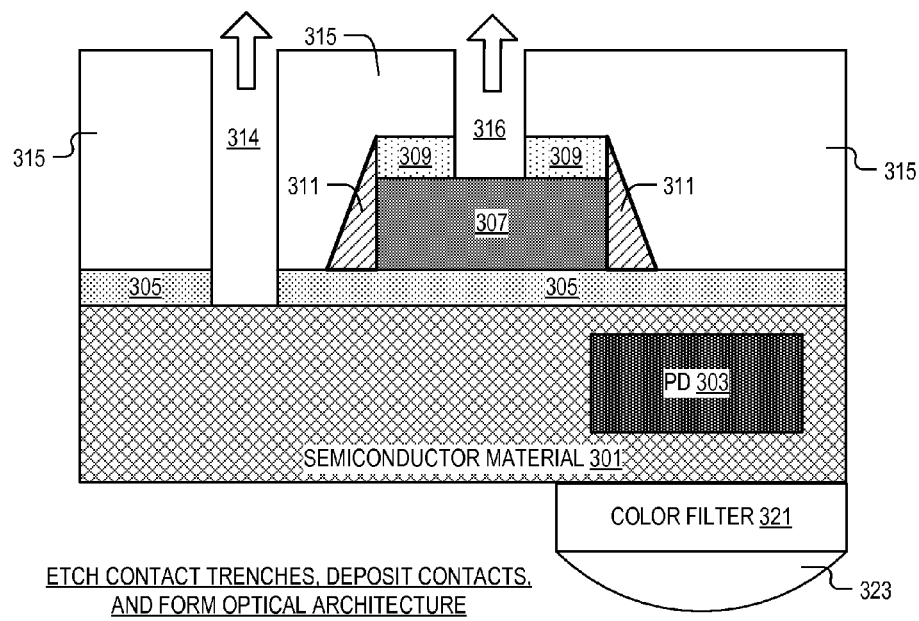

FIG. 3D depicts an illustration of etching trenches 314 and 316 in the encapsulation material 315. First trench 314 extends through the encapsulation material 315 and the layer of dielectric material 305, and second trench 316 extends through the encapsulation material 315 and the layer of hard mask material 309. In one example, it is worth noting that when etching second trench 316 in encapsulation material 315, layer of hard mask material 309 slows etching of second trench 316 such that contact with transfer gate 307 can be precisely controlled. In the depicted example, after trenches 314 and 316 are etched, electrical contacts are deposited in first trench 314 and second trench 316. The electrical contact in first trench 314 may be electrically connected to semiconductor material 301, and the electrical contact in second trench 316 may be electrically connected to transfer gate 307. In one example, electrical contacts may be a metal such as copper, aluminum, silver, titanium, tungsten, or otherwise.

In the depicted example, optical architecture is also formed. Optical architecture is disposed such that semiconductor material 301 is located between the optical architecture and transfer gate 307 (forming a backside illuminated image sensor). However, in another example, the optical architecture may be disposed on the same side of semiconductor material 301 as transfer gate 307 (forming a frontside illuminated image sensor). Optical architecture includes microlens layer 323 and color filter layer 321. In one example, color filter layer 321 includes red, green, and blue color filters which may be arranged into a Bayer pattern, EXR pattern, X-trans pattern, or the like. However, in a different or the same example, color filter layer 321 may include infrared filters, ultraviolet filters, or other light filters that isolate invisible portions of the EM spectrum. In the same or a different example, microlens layer 323 is formed on color filter layer 321 such that color filter layer 321 is disposed between microlens layer 323 and semiconductor material 301. Microlens layer 323 may be fabricated from a photo-active polymer that is patterned on the surface of color filter layer 321. Once rectangular blocks of polymer are patterned on the surface of color filter layer 321, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a semiconductor material including a photodiode disposed in the semiconductor material;
   a transfer gate disposed proximate to an edge of the photodiode and positioned to extract image charge from the photodiode;
   a dielectric layer disposed between the semiconductor material and the transfer gate; and
   a hard mask disposed in an encapsulation layer, wherein lateral bounds of the hard mask are coextensive with lateral bounds of the transfer gate, and wherein a first contact trench extends through the encapsulation layer and through the dielectric layer and contacts the semiconductor material, and wherein a second contact trench extends through the encapsulation layer and through the hard mask and contacts the transfer gate.

2. The image sensor of claim 1, further comprising transfer gate spacers disposed on lateral edges of the transfer gate, wherein a cross sectional area of the transfer gate spacers is larger in a direction of the semiconductor material.

3. The image sensor of claim 1 further comprising a first electrical contact and a second electrical contact, wherein the first electrical contact is disposed in the first contact trench and is electrically coupled to the semiconductor material, and wherein the second electrical contact is disposed in the second contact trench and is electrically coupled to the transfer gate.

4. The image sensor of claim 1, further comprising a floating diffusion disposed in the semiconductor material proximate to the photodiode and at least in part under the transfer gate.

5. The image sensor of claim 1, further comprising control circuitry and readout circuitry, wherein the control circuitry is coupled to the photodiode to control operation of the photodiode, and readout circuitry is coupled to the photodiode to readout image charge generated in the photodiode.

6. The image sensor of claim 5, further comprising function logic, wherein the function logic is coupled to the readout circuitry to alter image charge readout out of the photodiode.

7. The image sensor of claim 1, wherein the hard mask is a dielectric material.

8. The image sensor of claim 7, wherein the hard mask is one of silicon oxide, silicon nitride, or silicon oxynitride.

9. The image sensor of claim 1, wherein the dielectric layer is a high-k metal oxide.

* * * * *